US012644935B2

(12) United States Patent
Patki

(10) Patent No.: US 12,644,935 B2
(45) Date of Patent: Jun. 2, 2026

(54) SYSTEM FOR DETERMINING IDENTICALNESS AMONGST WIRE HARNESSES

(71) Applicant: Sandeep Suhas Patki, Pune (IN)

(72) Inventor: Sandeep Suhas Patki, Pune (IN)

( * ) Notice: Subject to any disclaimer, the term of this patent is extended or adjusted under 35 U.S.C. 154(b) by 204 days.

(21) Appl. No.: 18/566,000

(22) PCT Filed: Dec. 5, 2022

(86) PCT No.: PCT/IB2022/061756
§ 371 (c)(1),
(2) Date: Nov. 30, 2023

(87) PCT Pub. No.: WO2023/105379
PCT Pub. Date: Jun. 15, 2023

(65) Prior Publication Data
US 2024/0255587 A1 Aug. 1, 2024

(30) Foreign Application Priority Data
Dec. 6, 2021 (IN) .............................. 202121056585

(51) Int. Cl.
*G01R 31/67* (2020.01)
*G01R 31/69* (2020.01)

(52) U.S. Cl.
CPC ............. *G01R 31/67* (2020.01); *G01R 31/69* (2020.01)

(58) Field of Classification Search
CPC ........ G01R 31/66; G01R 31/54; G01R 31/55;

G01R 31/60; G01R 31/67; G01R 31/327; G01R 31/69; G01R 31/58; G01R 27/205; G01R 27/20; G06F 2113/16; G06F 2119/16; B60R 16/0207
See application file for complete search history.

(56) References Cited

U.S. PATENT DOCUMENTS

2013/0162262 A1 * 6/2013 Johnson ................. G01R 31/58
324/539

FOREIGN PATENT DOCUMENTS

| IN | 202121035064 | 10/2021 |
| IN | 202121035065 | 10/2021 |

* cited by examiner

*Primary Examiner* — Son T Le
(74) *Attorney, Agent, or Firm* — Vani Moodley, Esq.

(57) ABSTRACT

The present invention relates to a system (100a or 100b) for determining the details of a physical parameter in wire harnesses. The existing systems require multiple measurement cycles. The system provides a single setup to measure multiple wire harnesses. The system includes a measuring unit (40) adapted to measure the electrical parameters across a first wire harness (20c) and a second wire harness (30) when electrical parameters are supplied thereto at positions (50 and 60, 70 and 180), a workstation (210) receives measured electrical parameters from the measuring unit (40) and adapted to determine identicalness details of the second wire harness (30) based on the received measured electrical parameters and a display unit (13) is adapted to display the determined results. The present invention also provides a method (200a or 200b) for determining identicalness details amongst wire harnesses.

15 Claims, 9 Drawing Sheets

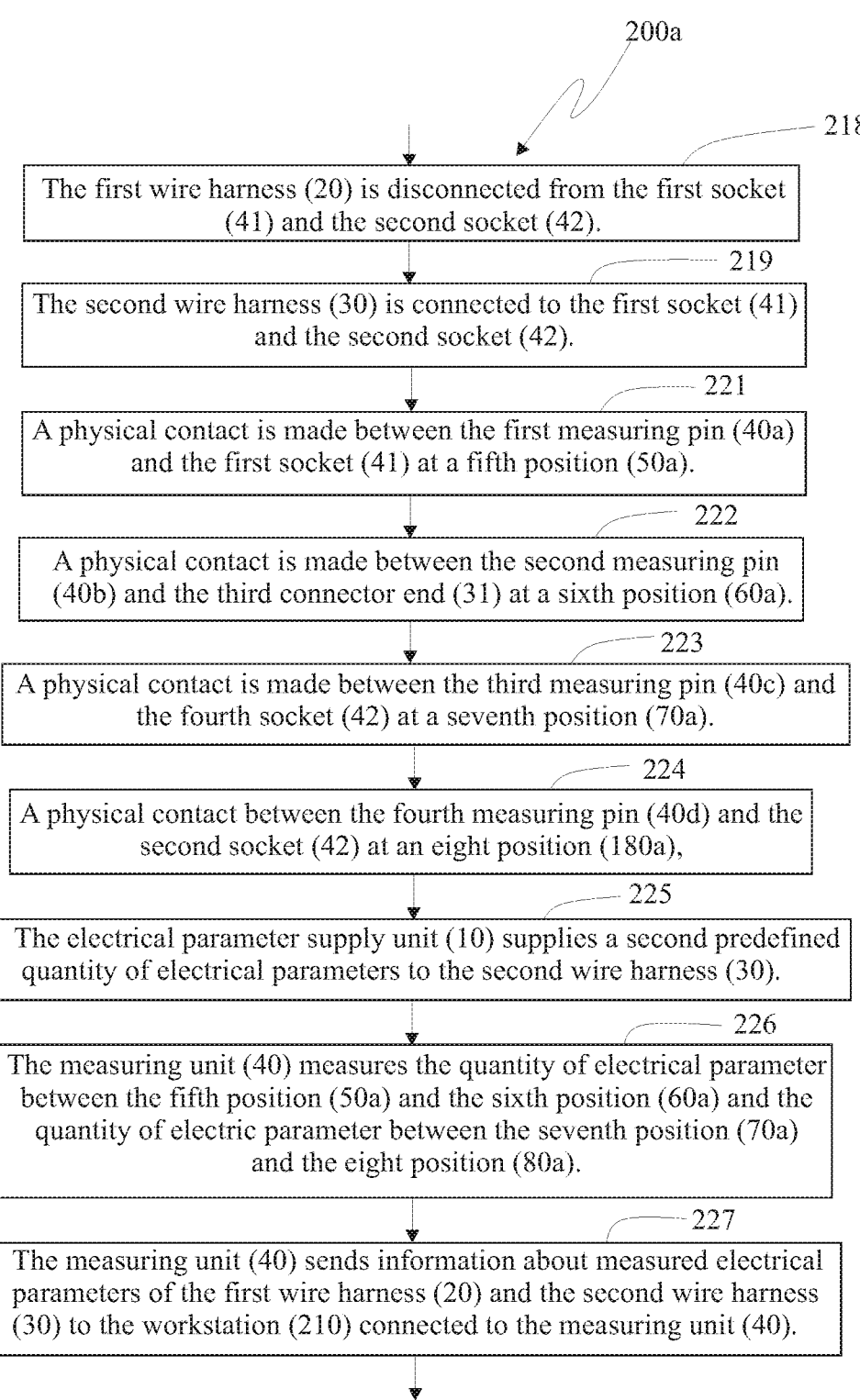
Figure 3(contd...)

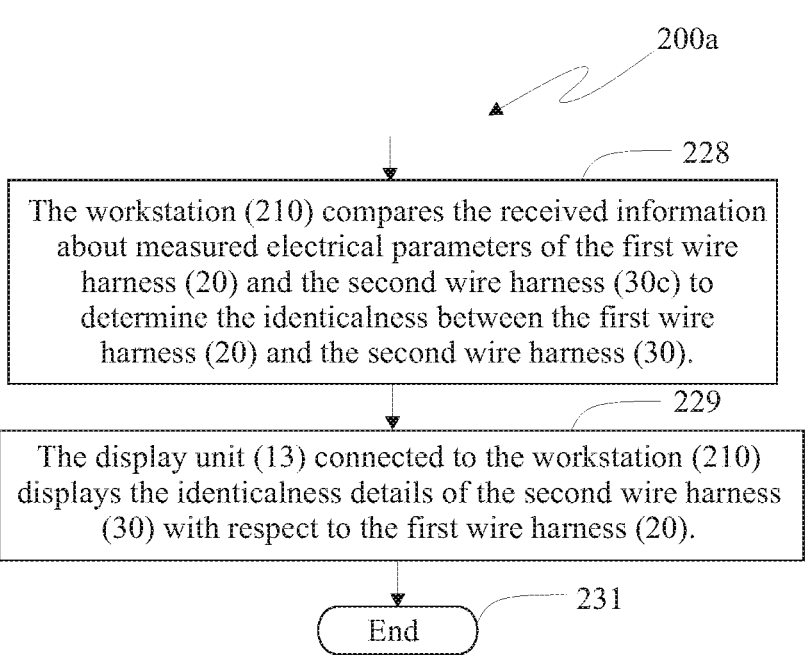

200a

228

The workstation (210) compares the received information about measured electrical parameters of the first wire harness (20) and the second wire harness (30c) to determine the identicalness between the first wire harness (20) and the second wire harness (30).

229

The display unit (13) connected to the workstation (210) displays the identicalness details of the second wire harness (30) with respect to the first wire harness (20).

231

End

Figure 3(contd...)

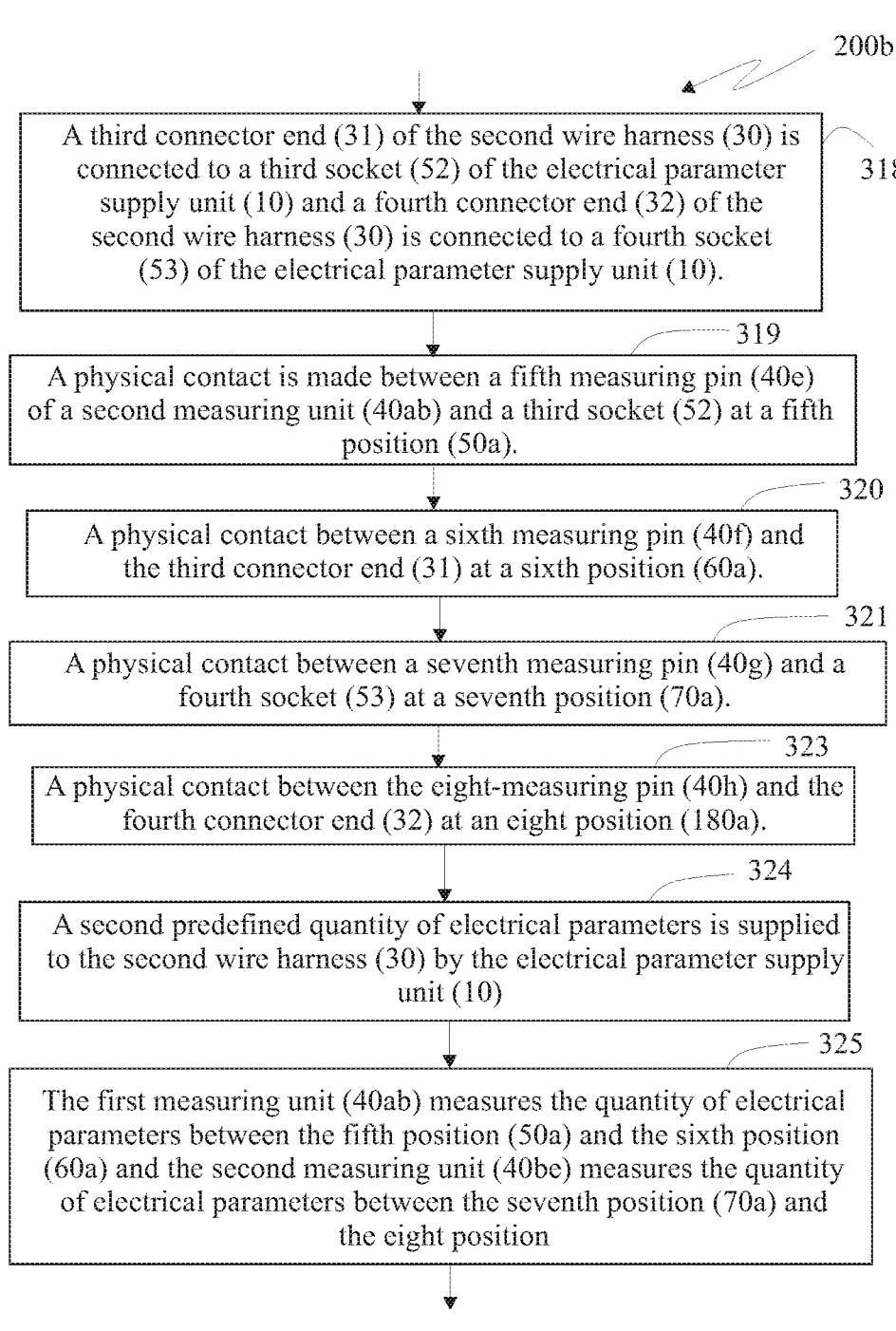

200b

A third connector end (31) of the second wire harness (30) is connected to a third socket (52) of the electrical parameter supply unit (10) and a fourth connector end (32) of the second wire harness (30) is connected to a fourth socket (53) of the electrical parameter supply unit (10).

318

A physical contact is made between a fifth measuring pin (40e) of a second measuring unit (40ab) and a third socket (52) at a fifth position (50a).

319

A physical contact between a sixth measuring pin (40f) and the third connector end (31) at a sixth position (60a).

320

A physical contact between a seventh measuring pin (40g) and a fourth socket (53) at a seventh position (70a).

321

A physical contact between the eight-measuring pin (40h) and the fourth connector end (32) at an eight position (180a).

323

A second predefined quantity of electrical parameters is supplied to the second wire harness (30) by the electrical parameter supply unit (10)

324

The first measuring unit (40ab) measures the quantity of electrical parameters between the fifth position (50a) and the sixth position (60a) and the second measuring unit (40be) measures the quantity of electrical parameters between the seventh position (70a) and the eight position

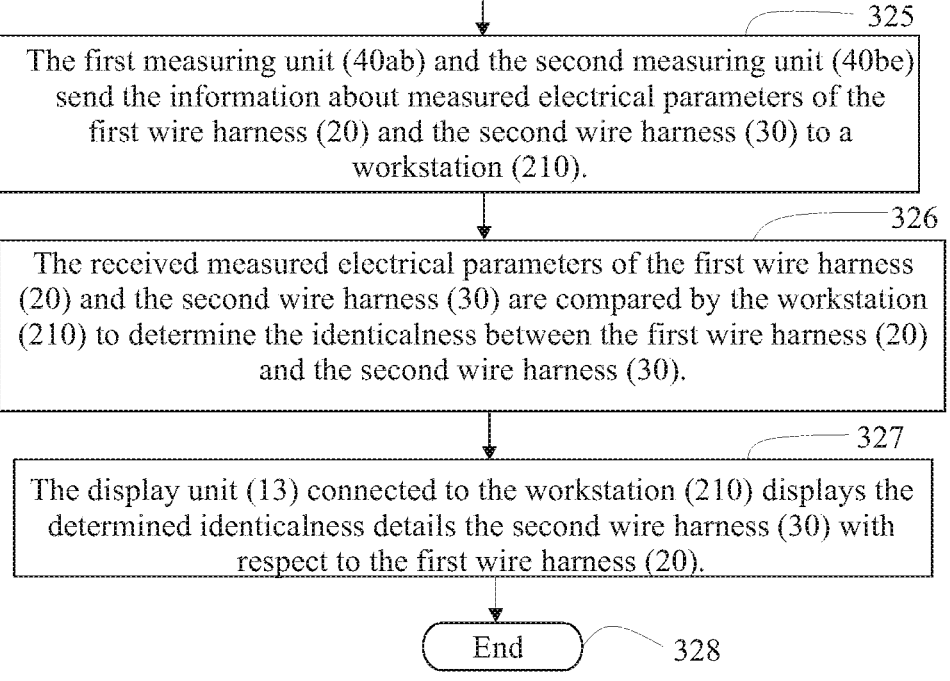

The first measuring unit (40ab) and the second measuring unit (40be) send the information about measured electrical parameters of the first wire harness (20) and the second wire harness (30) to a workstation (210).

325

The received measured electrical parameters of the first wire harness (20) and the second wire harness (30) are compared by the workstation (210) to determine the identicalness between the first wire harness (20) and the second wire harness (30).

326

The display unit (13) connected to the workstation (210) displays the determined identicalness details the second wire harness (30) with respect to the first wire harness (20).

327

End

SYSTEM FOR DETERMINING IDENTICALNESS AMONGST WIRE HARNESSES

FIELD OF THE INVENTION

The present invention relates to wire harnesses. More specifically, the present invention relates to a system for determining identicalness amongst wire harnesses.

BACKGROUND OF THE INVENTION

Wire harness(es) are typically used to provide electrical connectivity or any such connectivity and transmit signals (control signals) between functional units of devices in an aircraft, a spacecraft, a vehicle, a boat, etc. Further, the wire harness is used in wide applications such as electronic devices, home appliances, home automation systems, automobiles, construction machinery and the like. Typically, a wire harness includes one or more wire segments, and two or more connector ends. Two or more connector ends connects one or more wire segments.

Due to wide area of application for wire harnesses, it is essential to measure the quality of the wire harness to determine usability of a particular wire harness for a specific application. The quality of a wire harness is dependent on the physical parameters of the wire harness such length, diameter, no. of wire segments etc. Existing systems measure the quality of the wire harness using electrical measurements such as voltage drop test, continuity test by using electrical measurement devices. Also, some physical testing equipment such as manual inspection, photographic analysis, tensile testing machines etc.

However, the present inspection methods only focus on measurement of electrical parameters to determine quality of the wire harness without establishing correlation with the physical parameters i.e. the physical parameters such as length, diameter, air gap etc. cannot be predicted based on the electrical parameters. Also, the measurement of the physical parameters of wire harnesses needs frequent measurement cycles for each wire harness i.e. there is a need to perform testing on each wire harness to determine individual quality. Hence, the quality checking process becomes time consuming. Also, the present systems and methods involve destructive testing i.e. there is need to distort the wire harness to measure the quality. Further, the present systems do not involve determination of similarity between the wire harnesses based on the physical or geometrical parameters.

IN202121035065A discloses an instrument for comparing wire harnesses. But, the constructive features of the instrument is (are) not adapted to measure the voltage (continuity) at a fixed positions on the wire harnesses from a reference for comparing the identicalness of amongst the wire harnesses.

IN202121035064A discloses an instrument for comparing wire harnesses. But, the constructive features of the instrument is (are) not adapted to measure the voltage (continuity) at a fixed positions on the wire harnesses from a reference for comparing the identicalness of amongst the wire harnesses.

US20150241473A1 discloses a system for performing electrical tests to electrical wiring harnesses. The system tests the wire harnesses by projecting devices images concerning the test of the electrical wiring harness allowing operators to perform the test using only the support information provided by said images.

US20010010030A1 discloses a Method for inspecting wire harness. In the method the quality of the wire harness is judged by comparing an output from said each terminal upon inputting of said input with a standard output from each terminal of a normal wire harness upon inputting of said input Therefore, there is a need for a system for determining identicalness amongst wire harnesses, which overcomes the problems of the prior art.

OBJECTS OF THE INVENTION

An object of the present invention is to provide a system for determining identicalness amongst wire harnesses.

Another object of the present invention is to provide a system for determining identicalness amongst wire harnesses, which eliminates need of multiple measurement cycles to reduce the time for quality check.

Yet another object of the present invention is to provide a system for determining identicalness amongst wire harnesses, wherein the system eliminates the cost required for arranging the setup for manual physical testing of the wire harness Another objective of the present invention is to provide a system for determining identicalness amongst wire harnesses, eliminating the need for destructive testing of the wire harness.

Still another object of the present invention is to provide a system for determining identicalness amongst wire harnesses, wherein the system is simple in construction and cost-effective.

SUMMARY OF THE INVENTION

The present invention relates to a system for determining identicalness amongst wire harnesses. The system includes a first wire harness is having one or more first connector ends and one or more second connector ends joined by one or more first wire segments and a second wire harness is having one or more third connector ends and one or more fourth connector ends joined by one or more second wire segments. The system further includes an electrical parameter supply unit adapted to supply one or more electrical parameters therefrom to the first wire harness when the first connector end is connected to a first socket of the electrical parameter supply unit and the second connector end is connected to a second socket of the electrical parameter supply unit operated accordingly. The electrical parameter supply unit is adapted to supply one or more electrical parameters therefrom to the second wire harness when the third connector end is connected to the first socket and the fourth connector end is connected to the second socket and the electrical parameter supply unit is operated accordingly.

Further, the system includes a measuring unit having a first measuring pin, a second measuring pin, a third measuring pin and a fourth measuring pin. In a first measurement cycle, the first measuring pin is adapted to have a physical contact with the first socket at a first position. The first position is a position on the first socket from a reference with a predefined first distance therebetween.

Further, the second measuring pin is adapted to have a physical contact with the first connector end at a second position. The second position is a position on the first connector end from the reference with a predefined second distance therebetween. The third measuring pin is adapted to have a physical contact with the second socket at a third position. The third position is a position on the second socket from the reference with a predefined third distance therebetween.

Further, the fourth measuring pin is adapted to have a physical contact with the second socket at a fourth position. The fourth position is a position on the second connector end from the reference with a predefined fourth distance therebetween. In the first measurement cycle, upon supplying a first predefined quantity of electrical parameter to the first wire harness, the measuring unit measures the quantity of electrical parameter between the first position and the second position and the quantity of electrical parameter between the third position and the fourth position.

Subsequently in a second measurement cycle, the first measuring pin is adapted to have a physical contact with the first socket at a fifth position. The fifth position is a position on the first socket from a reference with a predefined fifth distance therebetween, wherein the magnitude of the predefined first distance and the predefined fifth distance are same. The second measuring pin is adapted to have a physical contact with the third connector end at a sixth position. The sixth position is a position on the third connector end from the reference with a predefined sixth distance therebetween, wherein the magnitude of the predefined second distance and the predefined sixth distance are same.

Further, the third measuring pin is adapted to have a physical contact with the second socket at a seventh position. The seventh position is a position on the second socket from the reference with a predefined seventh distance therebetween, wherein the magnitude of the predefined third distance and the predefined seventh distance are same. The fourth measuring pin is adapted to have a physical contact with the second connector end at an eighth position. The eighth position is a position on the second connector end from the reference with a predefined eighth distance therebetween, wherein the magnitude of the predefined fourth distance and the predefined eighth distance are same.

Upon supplying a second predefined quantity of electrical parameter to the second wire harness, the measuring unit measures the quantity of electrical parameter between the fifth position and the sixth position and the quantity of electrical parameter between the seventh position and the eighth position. The quantity of the first predefined quantity of electrical parameters and the second predefined quantity of electrical parameters is same.

Further, a workstation is connected to the measuring unit. The measuring unit sends information about measured electrical parameters from the first measurement cycle and the second measurement cycle to the workstation. The first wire harness is a standard wire harness and the measured electrical parameter in the first measurement cycle is a standard quantity of electrical parameter. The workstation is adapted to compare the received measured electrical parameters of the first measurement cycle and the second measurement cycle to determine the identicalness between the first wire harness and the second wire harness. Further, a display unit is connected to the workstation is adapted to display the determined identicalness details of the second wire harness with respect to the first wire harness.

Further, the present invention relates to a method for determining identicalness amongst wire harnesses. The method includes connecting the first connector end to the first socket of the electrical parameter supply unit and the second connector end to the second socket of the electrical parameter supply unit, making the physical contact between the first measuring pin of a measuring unit and the first position, making the physical contact between the second measuring pin of the measuring unit and the first connector end at the second position, making the physical contact between the third measuring pin of the measuring unit and the second socket at the third position, making the physical contact between the fourth measuring pin of the measuring unit and the second connector end at the fourth position, supplying the first predefined quantity of electrical parameters to the first wire harness, measuring the quantity of electrical parameter between the first position and the second position and measuring the quantity of electrical parameter between the third position and the fourth position upon supplying the first predefined quantity of electrical parameters to the first wire harness, disconnecting the first wire harness from the first socket and second socket.

Further, connecting the second wire harness to the first socket and the second socket, making the physical contact between the first measuring pin and the first socket at the fifth position ($50a$), making the physical contact between the second measuring pin and the third connector end at the sixth position, making the physical contact between the third measuring pin and the fourth socket at the seventh position, making a physical contact between the fourth measuring pin and the second socket at the eighth position, supplying the second predefined quantity of electrical parameters to the second wire harness by the electrical parameter supply unit, Further, measuring the quantity of electrical parameter between the fifth position and the sixth position by the measuring unit and measuring the quantity of electric parameter between the seventh position and the eighth position by the measuring unit, sending information about measured electrical parameters of the first wire harness and the second wire harness to the workstation connected to the measuring unit, comparing the received information about measured electrical parameters of the first wire harness and the second wire harness by the workstation to determine the identicalness between the first wire harness and the second wire harness, displaying the determined identicalness details of the second wire harness with respect to the first wire harness by the display unit connected to the workstation.

Further, the present invention relates to a system for determining identicalness amongst wire harnesses. The system includes a first wire harness is having one or more first connector ends and one or more second connector ends joined by one or more first wire segments and a second wire harness is having one or more third connector ends and one or more fourth connector ends joined by one or more second wire segments.

The system includes an electrical parameter supply unit adapted to supply one or more electrical parameters therefrom to the first wire harness when the first connector end connected to a first socket of the electrical parameter supply unit and the second connector end is connected to a second socket of the electrical parameter supply unit and the electrical parameter supply unit is operated accordingly. The electrical parameter supply unit is adapted to supply one or more electrical parameters therefrom to the second wire harness when the third connector end connected to a third socket of the electrical parameter supply unit and the fourth connector end connected to a fourth socket of the electrical parameter supply unit and the electrical parameter supply unit (10) operated accordingly.

Further, the system includes a first measuring unit having a first measuring pin, a second measuring pin, a third measuring pin and a fourth measuring pin. The first measuring pin is adapted to have a physical contact with the first socket at a first position. The first position is a position on the first socket from a reference with a predefined first distance therebetween. The second measuring pin is adapted to have a physical contact with the first connector end at a second position.

The second position is a position on the first connector end from the reference with a predefined second distance therebetween. The third measuring pin is adapted to have a physical contact with the second socket at a third position. The third position is a position on the second socket from the reference with a predefined third distance therebetween. The magnitude of the predefined first distance and the magnitude of the predefined third distance is same.

Further, the fourth measuring pin is adapted to have a physical contact with the second connector end at a fourth position. The fourth position is a position on the second connector end from the reference with a predefined fourth distance therebetween. The magnitude of the predefined second distance and the magnitude of the predefined fourth distance is same. Upon supplying a first predefined quantity of electrical parameters to the first wire harness, the first measuring unit measures the quantity of electrical parameters between the first position and the second position and the quantity of electrical parameters between the third position and the fourth position.

Further, a second measuring unit having a fifth measuring pin, a sixth measuring pin, a seventh measuring pin and an eighth measuring pin. The fifth measuring pin is adapted to have a physical contact with the third socket at a fifth position. The fifth position is a position on the third socket from the reference with a predefined fifth distance therebetween. The magnitude of the predefined first distance and the predefined fifth distance are same. The sixth measuring pin is adapted to have a physical contact with the third connector end at a sixth position. The sixth position is a position on the third connector end (31) from the reference with a predefined sixth distance therebetween. The magnitude of the predefined second distance and the predefined sixth distance are same.

Further, the seventh measuring pin is adapted to have a physical contact with the fourth socket at a seventh position. The seventh position is a position on the fourth socket from the reference with a predefined seventh distance therebetween. The magnitude of the predefined third distance and the predefined seventh distance are same. The eighth measuring pin is adapted to have a physical contact with the fourth connector end at an eighth position. The eighth position is a position on the fourth connector end from the reference with a predefined eighth distance therebetween. The magnitude of the predefined fourth distance and the predefined eighth distance are same.

Upon supplying a second predefined quantity of electrical parameters to the second wire harness, the second measuring unit measures the quantity of electrical parameters between the fifth position, the sixth position and the quantity of electrical parameters between the seventh position and the eighth position. Further, a workstation is connected to the first measuring unit and the second measuring unit. The first measuring unit and the second measuring unit send information about measured electrical parameters of the first wire harness and the second wire harness to the workstation. The first wire harness is a standard wire harness and the measured electrical parameter of the first wire harness is a standard quantity of electrical parameter.

The workstation is adapted to compare the received measured electrical parameters of the first wire harness and the second wire harness to determine the identicalness between the first wire harness and the second wire harness.

A display unit connected to the workstation is adapted to display the determined identicalness details of the second wire harness with respect to the first wire harness.

Further, the present invention relates to a method for determining identicalness amongst wire harnesses. The method includes connecting the first connector end to the first socket of the electrical parameter supply unit and the second connector end to the second socket of the electrical parameter supply unit, making the physical contact between the first measuring pin of the first measuring unit and the first socket at the first position, making the physical contact between the second measuring pin of the first measuring unit and the first connector end at the second position, making the physical contact between the third measuring pin of the first measuring unit and the second socket at the third position.

Further, the method includes making a physical contact between the fourth measuring pin of the first measuring unit and the second connector end at the fourth position, supplying the first predefined quantity of electrical parameters to the first wire harness, measuring the quantity of electrical parameters between the first position and the second position and measuring the quantity of electrical parameters between the third position and the fourth position by the first measuring unit, connecting the third connector end to the third socket of the electrical parameter supply unit and the fourth connector end to the fourth socket of the electrical parameter supply unit.

Further, making the physical contact between the fifth measuring pin of the second measuring unit and the third socket at the fifth position, making a physical contact between the sixth measuring pin and the third connector end at the sixth position, making the physical contact between the seventh measuring pin and the fourth socket at the seventh position, making the physical contact between the eighth measuring pin and the fourth connector end at the eighth position, supplying the second predefined quantity of electrical parameters to the second wire harness, measuring the quantity of electrical parameters between the fifth position and the sixth position and measuring the quantity of electrical parameters between the seventh position and the eighth position by the second measuring unit.

Further, sending information about measured electrical parameters of the first wire harness and the second wire harness to the workstation by the first measuring unit and the second measuring unit respectively, comparing the received measured electrical parameters of the first wire harness and the second wire harness to determine the identicalness between the first wire harness and the second wire harness and displaying the determined identicalness details the second wire harness with respect to the first wire harness by a display unit connected to the workstation.

BRIEF DESCRIPTION OF DRAWINGS

The advantages and features of the present invention will be understood better with reference to the following detailed description and claims taken in conjunction with the accompanying drawings, wherein like elements are identified with like symbols, and in which:

DETAILED DESCRIPTION OF THE INVENTION

An embodiment of this invention, illustrating its features, will now be described in detail. The words "comprising," "having," "containing," and "including," and other forms thereof, are intended to be equivalent in meaning and be open-ended in that an item or items following any one of these words is not meant to be an exhaustive listing of such item or items or meant to be limited to only the listed item or items.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced items.

The disclosed embodiments are merely exemplary of the invention, which may be embodied in various forms.

The present invention relates to a system for determining identicalness amongst wire harnesses. The system interprets the identicalness amongst two or more wire harnesses based on the measurement of electrical parameters of the respective wire harness. The system reduces the time consumed for testing each individual wire harness to determine the quality of the wire harnesses. Also, the system involves a reduction in setup cost due to compact size and simple construction. The system eliminates the need to perform destructive testing of the wire harnesses to determine the quality, thereby resulting in cost reduction.

Figure 1:
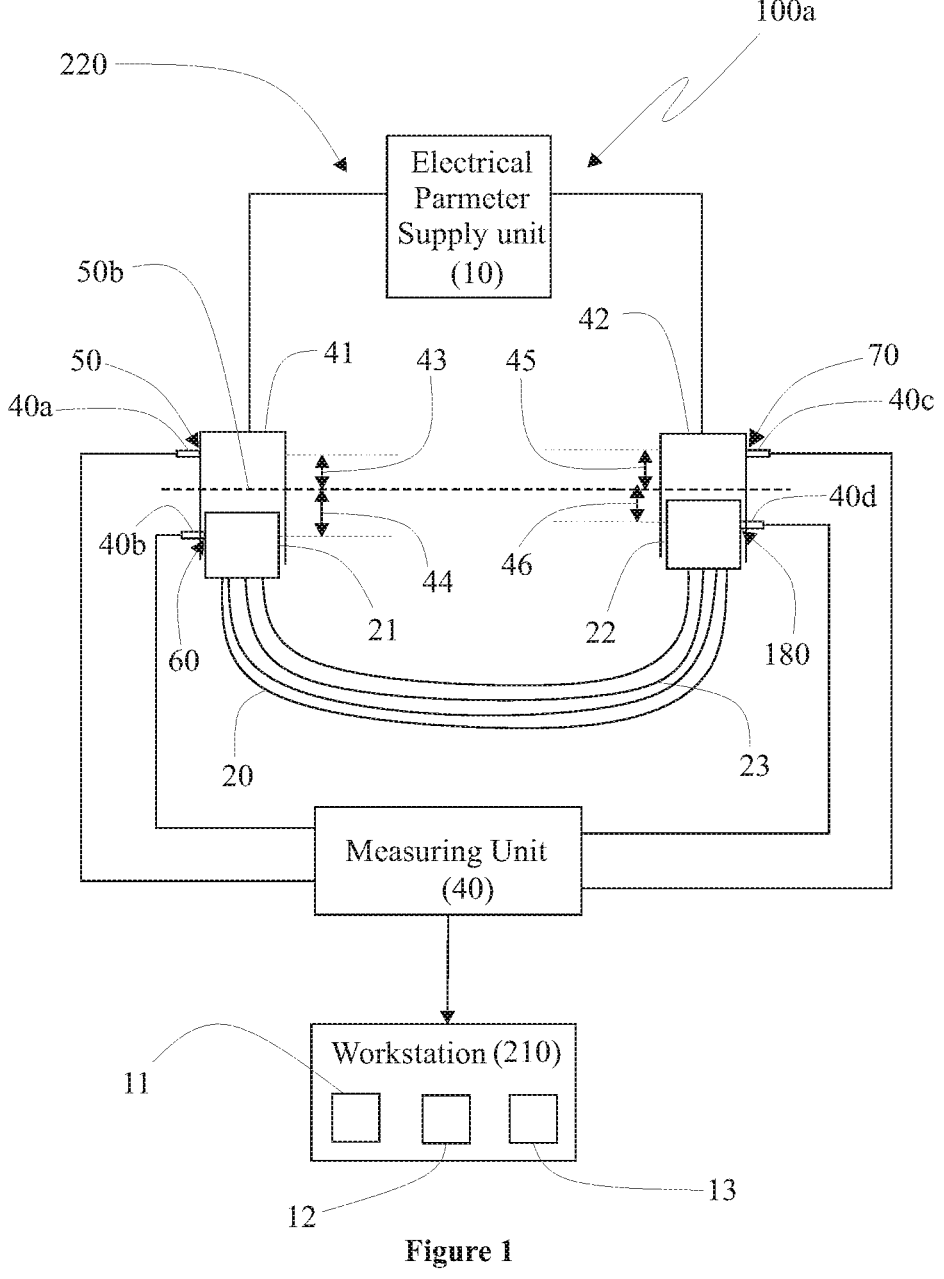
FIG. 1 shows a schematic diagram an embodiment of system for determining identicalness amongst wire harnesses connected a first wire harness in accordance with the present invention.

Referring to FIG. 1, an embodiment of a system (100*a*) for determining identicalness amongst wire harnesses is illustrated in accordance with the present invention. The identicalness within the wire harnesses is the quality or condition of wire harnesses to be exactly the same in terms of physical parameters such as length, diameter, no. of wire segments etc. The system (100*a*) includes an electrical parameter supply unit (10), a first wire harness (20), a second wire harness (30), a measuring unit (40), a workstation (210) and a display unit (13).

The first wire harness (20) has one or more first connector ends (21) and one or more second connector ends (22) joined together by one or more first wire segments (23). Further, the second wire harness (30) has one or more third connector ends (31) and one or more fourth connector ends (32) joined together by one or more second wire segments (33). The first connector end (21), the second connector end (22), the third connector end (31) and the fourth connector end (32) are hollow metallic ends having metal wires fixed therein to establish a connection with an external connector housing.

The electrical parameter supply unit (10) has a first socket (41) and a second socket (42). The first socket (41) and the second socket (42) are receiving ends for wire harnesses to establish an electrical connection between the wire harnesses and the electrical parameter supply unit (10). Further, the first connector end (21) is connected to the first socket (41) and the second connector end (22) is connected to the second socket (42).

The electrical parameter supply unit (10) is adapted to supply one or more electrical parameters therefrom to the first wire harness (20) connected thereto when the electrical parameter supply unit (10) is operated accordingly. In the preferred embodiment, the electrical parameter supply unit (10) is a voltage source or a current source or a frequency supply unit. The electric parameter supply unit (10) has an interface for controlling the operation of the electric parameter supply unit (10). The interface for controlling the operation of the electric parameter supply unit (10) is a manually operated or electronically operated control module.

Figure 2:
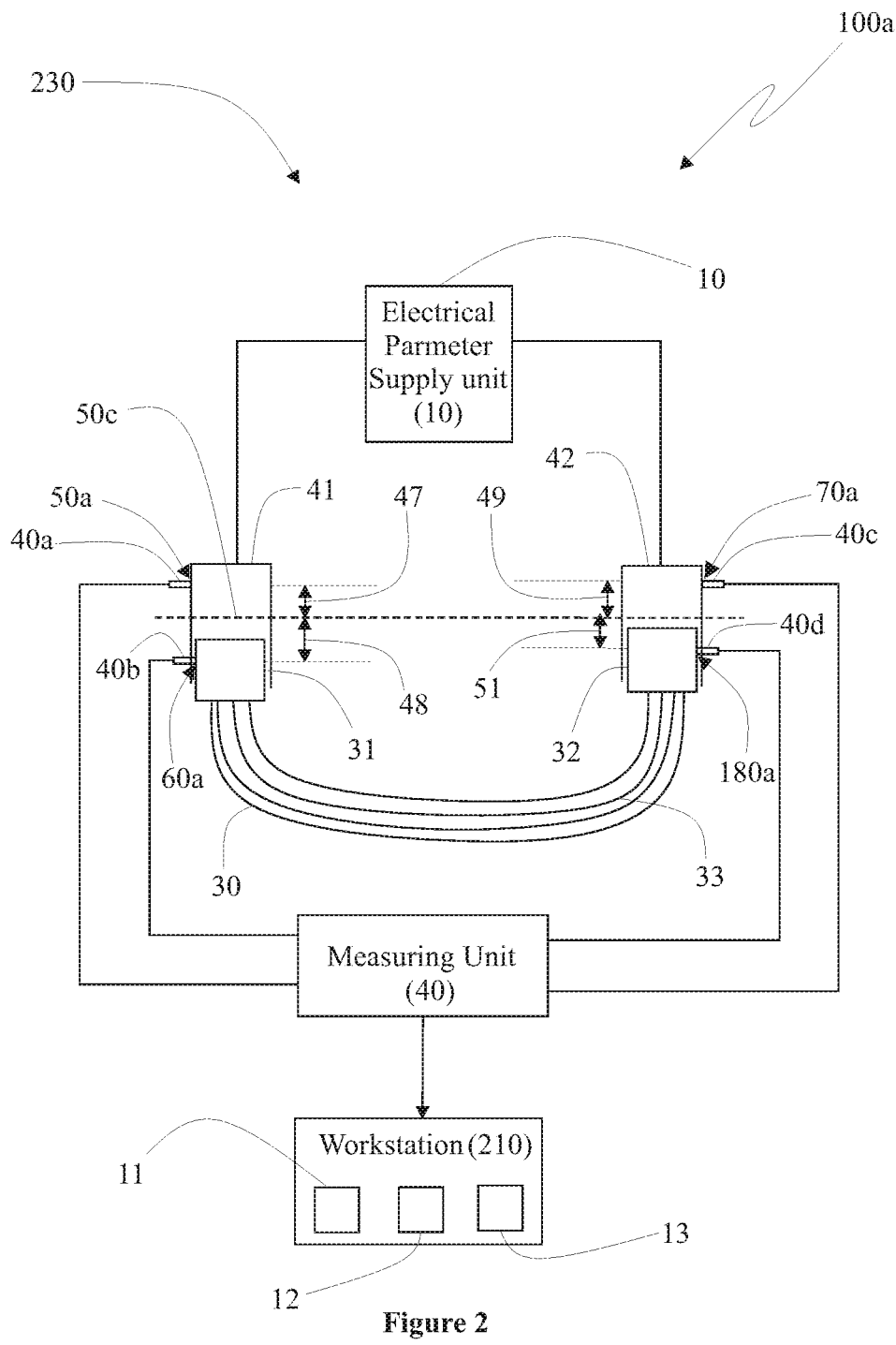
FIG. 2 shows a schematic diagram of an embodiment of system for determining identicalness amongst wire harnesses connected to a second wire harness in accordance with the present invention.

In the preferred embodiment, the electrical parameters supplied to the first wire harness (20) and the second wire harness (30) are an electromotive force or a frequency or an electric current or a combination of these. The measurement operation of the physical parameters of the wire harnesses is performed in two measuring cycle, a first measurement cycle (220) as shown in FIG. 1 and a second measurement cycle (230) as shown in FIG. 2. The second measurement cycle (230) is performed after the first measurement cycle (220).

The measuring unit (40) has a first measuring pin (40*a*), a second measuring pin (40*b*), a third measuring pin (40*c*) and a fourth measuring pin (40*d*) as shown in FIG. 1. In the preferred embodiment, the measuring unit (40) is a voltage sensor or a voltmeter or an ammeter or an LCR meter or a multimeter or an oscilloscope. A distance between the first measuring pin (40*a*) and the second measuring pin (40*b*) and a distance between the third measuring pin (40*c*) and the fourth measuring pin (40*d*) is adjustable. During the first measurement cycle (220), the first measuring pin (40*a*) is adapted to have a physical contact with the first socket (41) at a first position (50), as shown in FIG. 1.

The first position (50) is a position on the first socket (41) from a reference (50*b*) with a predefined first distance (43) therebetween as shown in FIG. 1. Further, the second measuring pin (40*b*) is adapted to have a physical contact with the first connector end (21) at a second position (60), as shown in FIG. 1. The second position (60) is on the first connector end (21) from the reference (50*b*) with a predefined second distance (44) therebetween as shown in FIG. 1.

Further, the third measuring pin (40*c*) is adapted to have a physical contact with the second socket (42) at a third position (70) as shown in FIG. 1. The third position (70) is a position on the second socket (42) from the reference (50*b*) with a predefined third distance (45) therebetween as shown in FIG. 1. Further, the fourth measuring pin (40*d*) is adapted to have a physical contact with the second connector end (22) at a fourth position (180) as shown in FIG. 1. The fourth position (180) is a position on the second connector end (22) from the reference (50*b*) with a predefined fourth distance (46) therebetween. In the preferred embodiment, the physical contact between the measuring pins and the sockets and the measuring pins and the connector ends are removable and a user can remove measuring pins from one position and connect to other positions.

During the operation of the first measurement cycle (220), the electric power supply unit (10) supplies a first predefined quantity of electrical parameter to the first wire harness (20). In the preferred embodiment, the first predefined quantity of electrical parameter supplied to the first wire harness (20) is an electromotive force or an electric current or a frequency or a combination of any of these.

The measuring unit (40) measures the quantity of electrical parameters between the first position (50) and the second position (60) and the quantity of electrical parameter between the third position (70) and the fourth position (180). The electric parameter measured between the first position (50) and the second position (60) and the electric parameter measured between the third position (70) and the fourth position (180) is a potential difference or an electric current or a resistance or an inductance or an impendence.

Further, the operation of the second measurement cycle (230) occurs subsequent to the first measurement cycle (230). The second measurement cycle (230) is shown in FIG. 2. The first measuring pin (40a) of the measuring unit (40) is adapted to have a physical contact with the first socket (41) at a fifth position (50a) as shown in FIG. 2. The fifth position (50a) is a position on the first socket (41) from a reference (50c) with a predefined fifth distance (47) therebetween as shown in FIG. 2. In the preferred embodiment, the magnitude of the predefined first distance (43) and the predefined fifth distance (47) are same.

Further, the second measuring pin (40b) is adapted to have a physical contact with the third connector end (31) at a sixth position (60a). The sixth position (60a) is a position on the third connector end (31) from the reference (50c) with a predefined sixth distance (48) therebetween as shown in FIG. 2. In the preferred embodiment, the magnitude of the predefined second distance (44) and the predefined sixth distance (48) are same.

Further, the third measuring pin (40c) is adapted to have a physical contact with the second socket (42) at a seventh position (70a). The seventh position (70a) is a position on the second socket (42) from the reference (50c) with a predefined seventh distance (49) therebetween as shown in FIG. 2. The magnitude of the predefined third distance (45) and the predefined seventh distance (49) are same. Further, the fourth measuring pin (40d) is adapted to have a physical contact with the fourth connector end (32) at an eighth position (180a). The eighth position (180a) is a position on the fourth connector end (32) from the reference (50c) with a predefined eighth distance (51) therebetween. The magnitude of the predefined fourth distance (46) and the predefined eighth distance (51) are same.

Further, the electric parameter supply unit (10) supplies a second predefined quantity of electrical parameter to the second wire harness (30). The second predefined quantity of electrical parameter supplied to the second wire harness (30) is a voltage or an electric current or a frequency or any combination of these. The measuring unit (40) measures the quantity of electrical parameters between the fifth position (50a) and the sixth position (60a). In the preferred embodiment, the quantity of the first predefined quantity of electrical parameters supplied to the first wire harness (20) and the second predefined quantity of electrical parameters supplied to the second wire harness (30) is the same.

Further, the workstation (210) receives the measured electrical parameters of the first measurement cycle (220) and the second measurement cycle (230) from the measuring unit (40). In the preferred embodiment, the first wire harness (20) is a standard wire harness and the measured electrical parameter in the first measurement cycle (220) is a standard quantity of electrical parameter. The physical parameters of the first wire harness (20) such as length, diameter, no. of wire segments etc. are the standard parameters against which the physical parameters of other wire harness are to be measured.

The workstation (210) includes a processing unit (11) and a memory unit (12) for storing the measured electrical parameters received from the first measurement cycle (220) and the second measurement cycle (230). In the preferred embodiment, the workstation (210) has a user interface such as keyboard or mouse or buttons to control the operation of the system (100a) such as switching the system (100a) between ON-OFF, calibration, switching the unit of measurement (i.e. ampere, microampere, volt, millivolt) etc.

The processing unit (11) is a microcontroller or a microprocessor or a controller or a processor or a logic controller, and the memory unit (12) is a cloud server or a hard drive or an IOT device. In the preferred embodiment, the workstation (210) is connected to an authentication system (not shown in the figure). The authentication system is a biometric system such as a fingerprint sensor or a face recognition system, or a password-protected system. The authentication system is adapted to provide access of the system (100) to an authenticated user only when the authentication system is operated accordingly.

The workstation (210) is adapted to compare the received measured electrical parameters of the first measurement cycle (220) and the second measurement cycle (230) to determine the identicalness details between the first wire harness (20) and the second wire harness (30). In the preferred embodiment, the identicalness details between the first wire harness (20) and the second wire harness (30) includes the identicalness of the physical parameters of the second wire harness (30) with the physical parameters of the first wire harness (20), the physical parameters of the first wire harness (20) and the second wire harness (30) are the quantitative parameters as length, diameter, volume of air gap and the qualitative parameters such as efficiency of the first wire harness (20) and the second wire harness (30).

In the preferred embodiment, the details of physical parameters of the first wire harness (20) are prestored in the workstation (210) as a standard value of physical parameters. The identicalness between the first wire harness (20) and the second wire harness (30) is the identicalness between the physical parameters therebetween.

The workstation (210) performs comparison between the physical parameter of the first wire harness (20) with the electrical parameters of the first wire harness (20) that are measured by the measuring unit (40). The prestored details of the physical parameters of the first wire harness (20) are determined by standard measuring methods such as manual or photographic inspection and manually stored in the workstation (210) as a reference value.

For example—Let us take the physical parameters of the first wire harness (20) and the second wire harness (30) be length, diameter, and volume of air gap within the wire segments of the wire harnesses. The magnitudes of the length, diameter and air gap of the first wire harness (20) be 5 cm, 10 mm and 1 mm$^3$ respectively. The magnitude of the length, diameter and air gap volume of the first wire harness (20) is measured by any standard measuring method. The measuring unit (40) measures the voltage drop across the first harness as 6V. Hence, the workstation (210) stores the values of 5 cm length, 10 mm diameter and 1 mm$^3$ for 6V voltage drop across the first wire harness (20).

The details of comparison of the first measurement cycle (220) and the second measurement cycle (230) are updated in the cloud memory of the memory unit (12) in real-time. The real-time measurement of the electrical parameters means the actual time or instantaneous measurement when the system (100a) is operating.

Further, a display unit (13) is connected to the workstation (210). In the preferred embodiment, the display unit (13) is a screen or a monitor. The display unit (13) is adapted to display the determined identicalness details of the second wire harness (30) with respect to the first wire harness (20). In the preferred embodiment, the determined identicalness details displayed by the display unit (13) includes a message displayed on the display unit (13) to indicate whether the second wire harness (30) is identical to the first wire harness (20). In another embodiment, an LED indicator which displays a light when the second wire harness (30) is identical to the first wire harness (20).

For example, let the first wire harness (20) and second wire harness (30) supplied with a current of 5 microamperes by the electrical parameter supply unit (10). In the first cycle of the measurement (220), the first measuring pin (40*a*) of the measuring unit (40) is made in contact with the first position (50) over the first socket (41) and the second measuring pin (40*b*) is made in contact with the second position (60) on the first connector end (21). The distance of the first position (50) from the reference (50*b*) be 1 cm and the distance of the second position (60) from the reference (50*b*) be 2 cm. The measuring unit (40) measures the potential difference across the third position (70) and the fourth position (180) as 5V. Further, the third measuring pin (40*c*) is made in physical contact with the third position (70) and the fourth measuring pin (40*d*) is made in physical contact with the fourth position (180). The distance of the third position (70) from the reference (50*b*) be 1 cm and the distance of the fourth position (180) from the reference (50*b*) be 2 cm. The measuring unit (40) measures the potential difference across the third position (70) and the fourth position (60) as 13 V. The measuring unit (40) calculates value of an average voltage within the first wire harness (20) as (5+13)/2=9V.

Subsequently, in the second measurement cycle (230), the measuring unit (40) measures the potential difference between the fifth position (50*a*) and the sixth position (60*a*) of the second wire harness (30) as 6V and the potential difference between the seventh position (70*a*) and the eighth position (180*a*) as 10V. The measuring unit (40) send the average measured value as (6+10)/2=8V to the workstation (210). Here, the first wire harness (20) is the standard wire harness. The workstation (210) compares the value 8V of the first wire harness (20) with the voltage value 9V measured for the second wire harness (20*c*). Here the voltage value for the second wire harness (9V) is not equal to that of the first wire harness (20). Hence, the display unit (13) displays a message as "ERROR" which indicates that the second wire harness (20V) is not identical to the first wire harness (20) and the LED indicator displays a red light.

Figure 3:
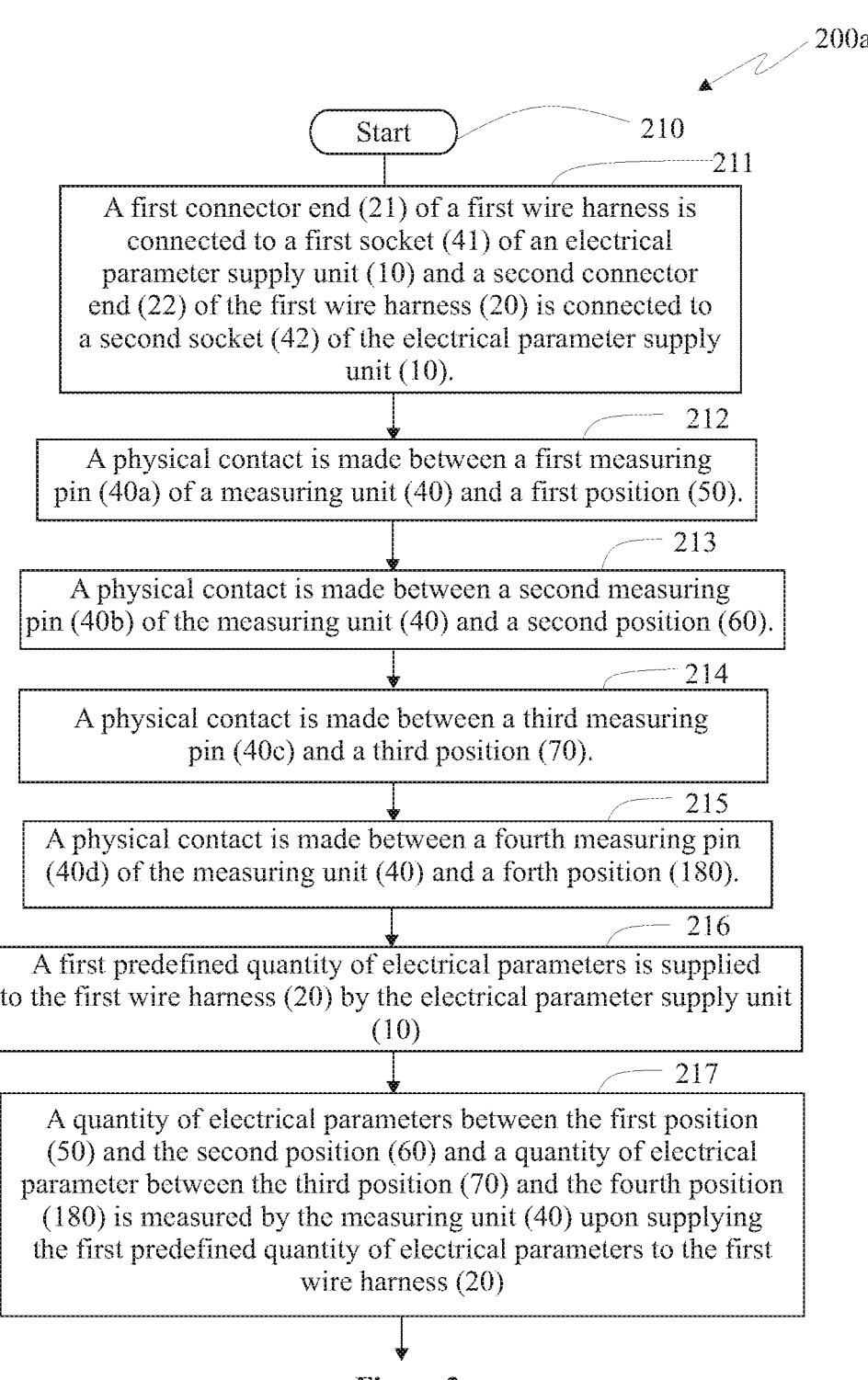
FIG. 3 shows a flow chart of an embodiment of a method for determining identicalness amongst wire harnesses in accordance with the present invention.

Referring now to the FIG. 3, a method (200*a*) for determining identicalness amongst wire harnesses in accordance with the present invention is illustrated. For the sake of brevity, the method (200*a*) is described in conjunction with the system (100*a*).

The method (200*a*) starts at step 210.

At step 211, the first connector end (21) of the first wire harness (20) is connected to the first socket (41) of the electrical parameter supply unit (10) and the second connector end (22) of the first wire harness (20) is connected to the second socket (42) of the electrical parameter supply unit (10).

At step 212, the physical contact is made between the first measuring pin (40*a*) of the measuring unit (40) and the first position (50). The first position (50) is the position on the first socket (41) from a reference (50*b*) with a predefined first distance (43) therebetween.

At step 213, the physical contact is made between the second measuring pin (40*b*) and the second position (60). The second position (60) is the position on the first connector end (21) from the reference (50*b*) with a predefined second distance (44) therebetween.

At step 214, the physical contact is made between the third measuring pin (40*c*) of the measuring unit (40) and the second socket (42) at the third position (70). The third position (70) is the position on the second socket (42) from the reference (50*b*) with the predefined third distance (45) therebetween.

At step 215, the physical contact between the fourth measuring pin (40*d*) of the measuring unit (40) and the second connector end (22) at the fourth position (180). The fourth position (180) is the position on the second connector end (22) from the reference (50*b*) with a predefined fourth distance (46) therebetween.

At step 216, the first predefined quantity of electrical parameters is supplied to the first wire harness (20) by the electrical parameter supply unit (10).

At step 217, the quantity of electrical parameters between the first position (50) and the second position (60) and the quantity of electrical parameter between the third position (70) and the fourth position (180) is measured by the measuring unit (40) upon supplying the first predefined quantity of electrical parameters to the first wire harness (20).

At step 218, the first wire harness (20) is disconnected from the first socket (41) and the second socket (42).

At step 219, the second wire harness (30) is connected to the first socket (41) and the second socket (42).

At step 221, a physical contact is made between the first measuring pin (40*a*) and the first socket (41) at the fifth position (50*a*). The fifth position (50*a*) is the position on the first socket (41) from the reference (50*c*) with the predefined fifth distance (47) therebetween. The magnitude of the predefined first distance (43) and the predefined fifth distance (47) are same.

At step 222, the physical contact is made between the second measuring pin (40*b*) and the third connector end (31) at the sixth position (60*a*). The sixth position (60*a*) is the position on the third connector end (31) from the reference (50*c*) with the predefined sixth distance (48) therebetween. The magnitude of the predefined second distance (44) and the predefined sixth distance (48) are same.

At step 223, the physical contact is made between the third measuring pin (40*c*) and the fourth socket (42) at the seventh position (70*a*). The seventh position (70*a*) is the position on the fourth socket (42) from the reference (50*c*) with the predefined seventh distance (49) therebetween. The magnitude of the predefined third distance (45) and the predefined seventh distance (49) are same.

At step 224, the physical contact between the fourth measuring pin (40*d*) and the second socket (42) at an eighth position (180*a*). The eighth position (180*a*) is the position on the second socket (42) from the reference (50*c*) with a predefined eighth distance (51) therebetween. The magnitude of the predefined fourth distance (46) and the predefined eighth distance (51) are same.

At step 225, the electrical parameter supply unit (10) supplies a second predefined quantity of electrical parameters to the second wire harness (30).

At step 226, the measuring unit (40) measures the quantity of electrical parameter between the fifth position (50*a*) and the sixth position (60*a*) and the quantity of electric parameter between the seventh position (70*a*) and the eighth position (180*a*).

At step 227, the measuring unit (40) sends information about measured electrical parameters of the first wire harness (20) and the second wire harness (30) to the workstation (210) connected to the measuring unit (40). The first wire harness (20) is a standard wire harness and the measured electrical parameter of the first wire harness (20) is a standard quantity of electrical parameter.

At step 228, the workstation (210) compares the received information about measured electrical parameters of the first wire harness (20) and the second wire harness (30) to determine the identicalness between the first wire harness (20) and the second wire harness (30).

At step 229, the display unit (13) connected to the workstation (210) displays the identicalness details of the second wire harness (30) with respect to the first wire harness (20).

The method (200*a*) ends at step 231.

In another embodiment, the system (100*b*) includes two separate measuring units. The system (100*b*) is less time consuming as compared to the system (100*a*), because the system (100*a*) measures the identicalness between the first wire harness (20) and the second wire harness (30) in two separate measuring cycles, whereas the system (100*b*) measures the physical parameters in only one cycle of measurement.

Figure 4:
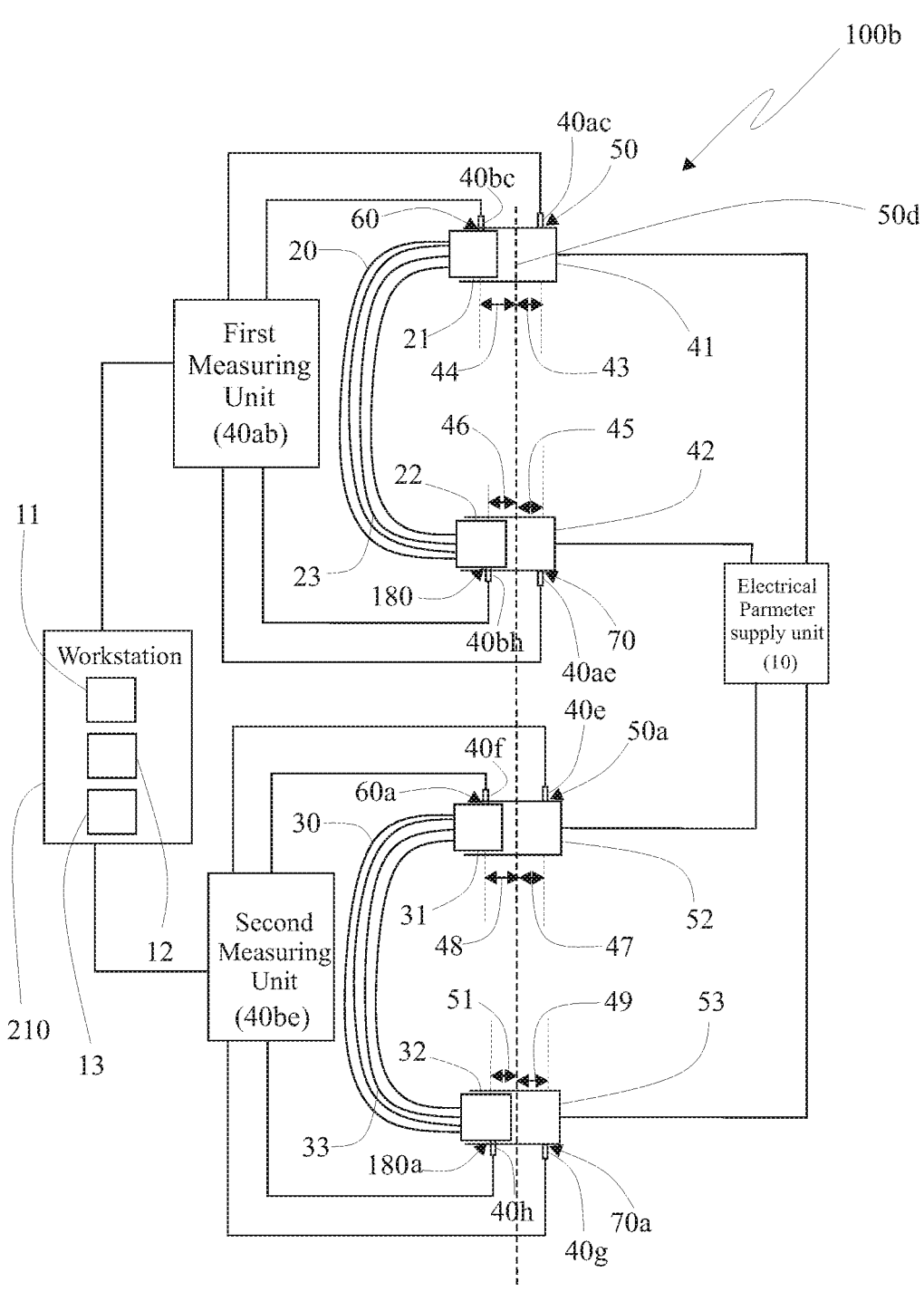
FIG. 4 shows a schematic block diagram of an embodiment of a system for determining identicalness amongst wire harnesses in accordance with the present invention.

Referring to FIG. 4, a system (100*b*) for determining identicalness amongst wire harnesses in accordance with the present invention is illustrated. The system (100*b*) includes an electrical parameter supply unit (10), a first wire harness (20), a second wire harness (30), a first measuring unit (40*ab*), a second measuring unit (40*be*), a workstation (210) and a display unit (13).

The first wire harness (20) has one or more first connector ends (21) and one or more second connector ends (22) joined by one or more first wire segments (23) and the second wire harness (30) has one or more third connector ends (31) and one or more fourth connector ends (32) joined by one or more second wire segments (33). The first connector end (21), the second connector end (22), the third connector end (31) and the fourth connector end (32) are hollow metallic ends having metal wires fixed therein to establish connection with an external connector housing.

The electrical parameter supply unit (10) is adapted to supply one or more electrical parameters therefrom to the first wire harness (20) and the second wire harness (30) connected thereto when the first connector end (21) is connected to a first socket (41) of the electrical parameter supply unit (10) and the second connector end (22) is connected to a second socket (42) of the electrical parameter supply unit (10) and the third connector end (31) is connected to a third socket (52) of the electrical parameter supply unit (10) and the fourth connector end (32) connected to a fourth socket (53) of the electrical parameter supply unit (10) and the electrical parameter supply unit (10) operated accordingly.

In the preferred embodiment, the electrical parameter supply unit (10) is a voltage source or a current source or a frequency supply unit. The electric parameter supply unit (10) has an interface for controlling the operation of the electric parameter supply unit (10). The interface for controlling the operation of the electric parameter supply unit (10) is a manually operated control module. In the preferred embodiment, the electrical parameters supplied to the first wire segment (20*c*) and the second wire harness (30*c*) are voltage or current or frequency.

The first measuring unit (40*ab*) has a first measuring pin (40*ac*), a second measuring pin (40*bc*), a third measuring pin (40*ae*) and the fourth measuring pin (40*bh*). In the preferred embodiment, the first measuring unit (40*ab*) is a voltage sensor or a voltmeter or an ammeter or an LCR meter or a multimeter or an oscilloscope. A distance between the first measuring pin (40*ac*) and the second measuring pin (40*bc*) is adjustable.

Figure 5:
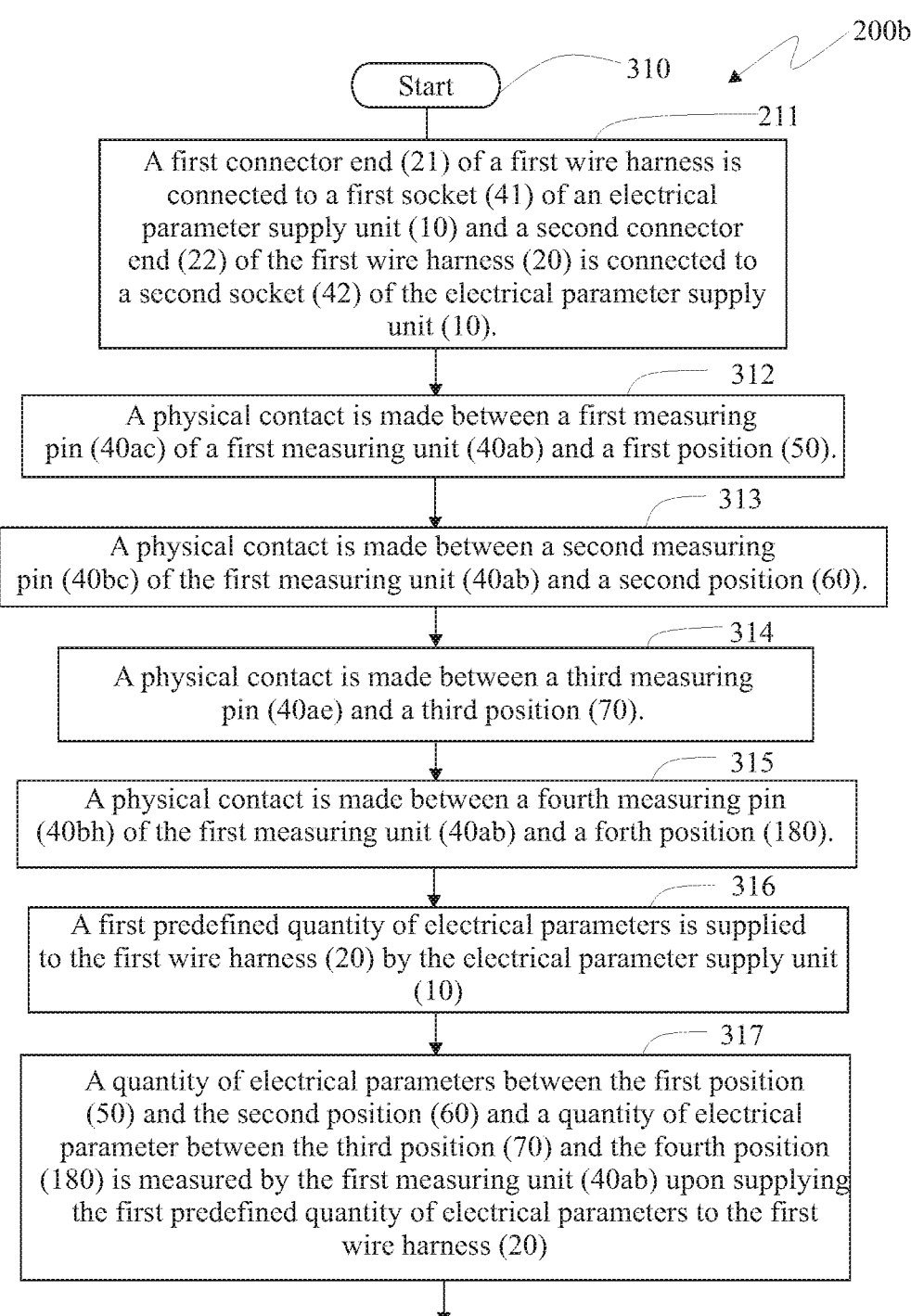
FIG. 5 shows a flow chart of a method for determining identicalness amongst wire harnesses in accordance with the present invention.

The first measuring pin (40*ac*) is adapted to have a physical contact (140) with the first socket (41) at a first position (50) as shown in FIG. 5. The first position (50) is a position on the first socket (41) from a reference (50*d*) with a predefined first distance (43) therebetween as shown in FIG. 4.

Further, the second measuring pin (40*bc*) is adapted to have a physical contact with the first connector end (21) at a second position (60) as shown in FIG. 4. The second position (60) is on the first connector end (21) from the reference (50*d*) with a predefined second distance (44) therebetween.

Further, the third measuring pin (40*ae*) is adapted to have a physical contact with the second socket (42) at a third position (70). The third position (70) is a position on the second socket (42) from the reference (50*d*) with a predefined third distance (45) therebetween. The magnitude of the predefined first distance (43) and the magnitude of the predefined third distance (45) is same.

Further, the fourth measuring pin (40*bh*) is adapted to have a physical contact with the second connector end (22) at a fourth position (180). The fourth position (180) is a position on the second connector end (22) from the reference (50*d*) with a predefined fourth distance (46) therebetween. The magnitude of the predefined second distance (44) and the magnitude of the predefined fourth distance (46) is same.

During the operation of the system (100*b*), the electric power supply unit (10) supplies a first predefined quantity of electrical parameter to the first wire harness (20). In the preferred embodiment, the first predefined quantity of electrical parameter supplied to the first wire harness (20) is an electromotive force or an electric current or a frequency or a combination of any of these.

The first measuring unit (40*ab*) measures the quantity of electrical parameters between the first position (50) and the second position (60). The electric parameter measured between the first position (50) and the second position (60) is a potential difference or an electric current or a resistance or an inductance or an impendence.

Further, the second measuring unit (40*be*) has a fifth measuring pin (40*e*), a sixth measuring pin (40*f*), a seventh measuring pin (40*g*) and an eighth measuring pin (40*h*). The fifth measuring pin (40*e*) of the second measuring unit (40*be*) is adapted to have a physical contact with the third socket (52) at a fifth position (50*a*). The fifth position (50*a*) is a position on the third socket (52) from the reference (50*d*) with a predefined fifth distance (47) therebetween. A distance between the third measuring pin (40*ae*) and the fourth measuring pin (40*bh*) is adjustable. The magnitude of the predefined first distance (43) and the predefined fifth distance (47) are same.

Further, the sixth measuring pin (40*f*) is adapted to have a physical contact with the third connector end (31) at a sixth position (60*a*). The sixth position (60*a*) is a position on the third connector end (31) from the reference (50*d*) with a predefined sixth distance (48) therebetween. The magnitude of the predefined second distance (44) and the predefined sixth distance (48) are same.

Further, the seventh measuring pin (40g) is adapted to have a physical contact with the fourth socket (53) at a seventh position (70a). The seventh position (70a) is a position on the fourth socket (53) from the reference (50d) with a predefined seventh distance (49) therebetween. The magnitude of the predefined third distance (45) and the predefined seventh distance (49) are same.

Further, the eighth measuring pin (40h) is adapted to have a physical contact with the fourth connector end (32) at an eight position (180a). The eighth position (180a) is a position on the fourth connector end (32) from the reference (50d) with a predefined eighth distance (51) therebetween. The magnitude of the predefined fourth distance (46) and the predefined eighth distance (51) are same.

Further, the electric parameter supply unit (10) supplies a second predefined quantity of electrical parameter to the second wire harness (30). The second predefined quantity of electrical parameter supplied to the second wire segment (30) is a voltage or an electric current or a frequency or any combination of these. The second measuring unit (40be) measures the quantity of electrical parameters between the fifth position (50a) and the sixth position (60a) and the quantity of electrical parameters between the seventh position (70a) and the eighth position (180a). In the preferred embodiment, the quantity of the first predefined quantity of electrical parameters supplied to the first wire harness (20) and the second predefined quantity of electrical parameters supplied to the second wire harness (30) is the same.

Further, the workstation (210) is connected to the first measuring unit (40ab) and the second measuring unit (40be). The workstation (210) receives the measured electrical parameters of the first wire harness (20) and the second wire harness (30) by the first measuring unit (40ab) and the second measuring unit (40be). In the preferred embodiment, the workstation (210) has a user interface such as keyboard or mouse or buttons to control the operation of the system (100b) such as switching the system (100b) between ON-OFF, calibration, switching the unit of measurement (i.e. ampere, microampere, volt, millivolt) etc. In the preferred embodiment, the first wire harness (20) is a standard wire harness and the measured electrical parameter of the first wire harness (20) is a standard quantity of electrical parameter. The physical parameters of the first wire harness (20) such as length, diameter, no. of wire segments etc. are the standard parameters against which the physical parameters of other wire harness are to be measured.

Further, in the system (100b), the workstation (210) includes a processing unit (11) and a memory unit (12) for storing the measured electrical parameters received from the first wire harness (20) and the second wire harness (30). The processing unit (11) is a microcontroller or a microprocessor or a controller or a processor or a logic controller and the memory unit (12) is a cloud server or a hard drive or an IOT device.

In the preferred embodiment, the workstation (210) is connected to an authentication system (not shown in figure). The authentication system is a biometric system such as a fingerprint sensor or a face recognition system, or a password-protected system. The authentication system is adapted to provide access of the system (100) to an authenticated user only when the authentication system is operated accordingly.

The workstation (210) is adapted to compare the received measured electrical parameters of the first wire harness (20)

and the second wire harness (30) to determine the identicalness details between the first wire harness (20) and the second wire harness (30). In the preferred embodiment, the identicalness details between the first wire harness (20) and the second wire harness (30) includes the identicalness of the physical parameters of the second wire harness (30) with the physical parameters of the first wire harness (20), the physical parameters of the first wire harness (20) and the second wire harness (30) are the quantitative parameters as length, diameter, volume of air gap and the qualitative parameters such as efficiency of the first wire harness (20) and the second wire harness (30).

In the preferred embodiment, the details of physical parameters of the first wire harness (20) are prestored in the workstation (210) as standard value of physical parameters. The identicalness between the first wire harness (20) and the second wire harness (30) is the identicalness between the physical parameters therebetween.

The workstation (210) performs comparison between the physical parameter of the first wire harness (20) with the electrical parameters of the first wire harness (20) that are measured by the first measuring unit (40). The prestored details of the physical parameters of the first wire harness (20) are determined by standard measuring methods such as manual or photographic inspection and manually stored in the workstation (210) as a reference value.

For example—Let us take the physical parameters of the first wire harness (20) and the second wire harness (30) be length, diameter, and volume of air gap within the wire segments of the wire harnesses. The magnitudes of the length, diameter and air gap of the first wire harness (20) be 6 cm, 11 mm and 2 mm$^3$ respectively. The magnitude of the length, diameter and air gap volume of the first wire harness (20) is measured by any standard measuring method. The first measuring unit (40ab) measures the voltage drop across the first harness as 7V. Hence, the workstation (210) stores the values of 6 cm length, 11 mm diameter and 2 mm$^3$ air gap for 7V voltage drop across the first wire harness (20).

The details of comparison of the first wire harness (20) and the second wire harness (30) are updated in the cloud memory of the memory unit (12) in real-time. The real-time measurement of the electrical parameters means the actual time or instantaneous measurement when the system (100b) is operating.

Further, a display unit (13) is connected to the workstation (210). In the preferred embodiment, the display unit (13) is a screen or a monitor. The display unit (13) is adapted to display the determined identicalness details of the second wire harness (30) with respect to the first wire harness (20). In the preferred embodiment, the determined identicalness details displayed by the display unit (13) includes a message displayed on the display unit (13) to indicate whether the second wire harness (30) is identical to the first wire harness (20). In another embodiment, an LED indicator which displays a light when the second wire harness (30) is identical to the first wire harness (20).

For example, let the first wire harness (20) and second wire harness (30) supplied with a current of 10 microamperes by the electrical parameter supply unit (10). The first measuring unit (40ab) measures the potential difference across the first position (50) and the second position (60) as 10V and the potential difference across the third position (70) and the fourth position (180) as 12V. The first measuring unit (40ab) sends an average value as (10+12)/2=11V to the workstation (210). The value measured by the first measuring unit (40ab) is sent to the workstation (210) and stored in the memory unit (12). Further, the second measuring unit (40be) measures the potential difference between the fifth position (50a) and the sixth position (60a) as 10V and the potential difference between the seventh position (70a) and the eighth position (180a) as 12V. The second measuring unit (40be) sends an average value as (10+12)/ 2=11V to the workstation.

The workstation (210) compares the value 11V from the first measuring unit (40ab) with the voltage value 11V measured by the second measuring unit (40be). As the voltage value for both first wire harness (20) and the second wire harness (30) are same, the display unit (13) displays a message as "ACCEPTED" or the LED indicator shows a green light which indicates that the second wire harness (30) is identical to the first wire harness (20).

Referring now to FIG. 6, a method (200b) for determining identicalness amongst wire harnesses in accordance with the present invention is illustrated. For the sake of brevity, the method (200b) is described in conjunction with the system (100b).

The method (200b) starts at step 310.

At step 311, the first connector end (21) of the first wire harness (20) is connected to the first socket (41) of the electrical parameter supply unit (10) and the second connector end (22) of the first wire harness (20) to the second socket (42) of the electrical parameter supply unit (10).

At step 312, a physical contact is made between the first measuring pin (40ac) of the first measuring unit (40ab) and the first socket (41) at the first position (50). The first position (50) is the position on the first socket (41) from a reference (50d) with the predefined first distance (43) therebetween.

At step 313, a physical contact between the second measuring pin (40bc) of the first measuring unit (40ab) and the first connector end (21) at the second position (60). The second position (60) is the position on the first connector end (21) from the reference (50d) with the predefined second distance (44) therebetween.

At step 314, a physical contact is made between the third measuring pin (40ae) of the first measuring unit (40ab) and the second socket (42) at the third position (70). The third position (70) is the position on the second socket (42) from the reference (50d) with the predefined third distance (45) therebetween.

At step 315, a physical contact between the fourth measuring pin (40bh) of the first measuring unit (40ab) and the second connector end (22) at the fourth position (180). The fourth position (180) is a position on the second connector end (22) from the reference (50d) with a predefined fourth distance (46) therebetween.

At step 316, the first predefined quantity of electrical parameters is supplied to the first wire harness (20) by the electrical parameter supply unit (10).

At step 317, the quantity of electrical parameters between the first position (50) and the second position (60) and the quantity of electrical parameters between the third position (70) and the fourth position (180) are measured by the first measuring unit (40ab).

At step 318, the third connector end (31) of the second wire harness (30) is connected to the third socket (52) of the electrical parameter supply unit (10) and the fourth connector end (32) of the second wire harness (30) is connected to the fourth socket (53) of the electrical parameter supply unit (10).

At step 319, a physical contact between the fifth measuring pin (40e) of the second measuring unit (40ab) and the third socket (52) at the fifth position (50a). The fifth position (50a) is the position on the third socket (52) from the reference (50d) with the predefined fifth distance (47) therebetween. The magnitude of the predefined first distance (41) and the predefined fifth distance (47) are same.

At step 320, a physical contact between the sixth measuring pin (40f) and the third connector end (31) at the sixth position (60a). The sixth position (60a) is the position on the third connector end (31) from the reference (50d) with the predefined sixth distance (48) therebetween. The magnitude of the predefined second distance (44) and the predefined sixth distance (48) are same.

At step 321, the physical contact between the seventh measuring pin (40g) and the fourth socket (53) at the seventh position (70a). The seventh position (70a) is the position on the fourth socket (53) from the reference (50d) with a predefined seventh distance (49) therebetween. The magnitude of the predefined third distance (45) and the predefined seventh distance (49) are same.

At step 322, the physical contact between the eighth measuring pin (40h) and the fourth connector end (32) at the eight position (180a). The eighth position (180a) is the position on the second socket (53) from the reference (50d) with the predefined eighth distance (51) therebetween. The magnitude of the predefined fourth distance (46) and the predefined eighth distance (51) are same.

At step 323, the second predefined quantity of electrical parameters is supplied to the second wire harness (30) by the electrical parameter supply unit (10). The quantity of the first predefined quantity of electrical parameters and the second predefined quantity of electrical parameters is same.

At step 324, the first measuring unit (40ab) measures the quantity of electrical parameters between the fifth position (50a) and the sixth position (60a) and the second measuring unit (40be) measures the quantity of electrical parameters between the seventh position (70a) and the eighth position (180a).

At step 325, the first measuring unit (40ab) and the second measuring unit (40be) send the information about measured electrical parameters of the first wire harness (20) and the second wire harness (30) to the workstation (210). In the preferred embodiment, the first wire harness (20) is a standard wire harness and the measured electrical parameter of the first wire harness (20) is a standard quantity of electrical parameter.

At step 326, the received measured electrical parameters of the first wire harness (20) and the second wire harness (30) are compared by the workstation (210) to determine the identicalness between the first wire harness (20) and the second wire harness (30).

At step 327, the display unit (13) connected to the workstation (210) displays the determined identicalness details the second wire harness (30) with respect to the first wire harness (20).

The method (200b) ends at step 328.

Similarly, as per the requirement of a user (testing operator), multiple wire harnesses can be connected to the system (100b) to compare with the standard wire harness. Here, the user can be a quality assurance engineer, a lab operator, or a research professional responsible for testing the wire harness activities.

Thus, the present invention provides a system (100a and 100b) having advantage of providing identification details amongst wire harnesses by measuring the electrical parameters thereacross and provides a reliable and efficient alternative to the wire harness selection as compared to manual physical inspection methods. The system (100a and 100b) also allows the quality check of multiple wire harnesses on a single setup, reducing operating time. Also, the system (100*a* and 100*b*) requires a simple and cost-effective measurement setup to inspect multiple wire harnesses at a time without affecting the accuracy of measurement. The system (100) also avoids the need of destructive testing methods such as cutting the wire segment, performing tension test on the wire segment until failure etc., thereby reduces the wastage of material of the wire harnesses.

The foregoing descriptions of specific embodiments of the present invention have been presented for purposes of illustration and description. They are not intended to be exhaustive or to limit the present invention to the precise forms disclosed, and obviously, many modifications and variations are possible in light of the above teaching. The embodiments were chosen and described in order to explain the principles of the present invention best and its practical application, to thereby enable others skilled in the art to best utilise the present invention and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present invention.

I claim:

1. A system (100*a*) for determining identicalness amongst wire harnesses, a first wire harness (20) is having one or more first connector ends (21) and one or more second connector ends (22) joined by one or more first wire segments (23) and a second wire harness (30) is having one or more third connector ends (31) and one or more fourth connector ends (32) joined by one or more second wire segments (33), the system (100*a*) includes an electrical parameter supply unit (10) adapted to supply one or more electrical parameters therefrom to the first wire harness (20) when the first connector end (21) connected to a first socket (41) of the electrical parameter supply unit (10) and the second connector end (22) is connected to a second socket (42) of the electrical parameter supply unit (10) operated accordingly; and the electrical parameter supply unit (10) is adapted to supply one or more electrical parameters therefrom to the second wire harness (20) when the third connector end (31) connected to the first socket (41) and the fourth connector end (32) is connected to the second socket (42) and the electrical parameter supply unit (10) operated accordingly, a workstation (210), a display unit (13) connected to the workstation (210), characterized in that the system (100*a*) comprises:

a measuring unit (40) having a first measuring pin (40*a*), a second measuring pin (40*b*), a third measuring pin (40*c*) and a fourth measuring pin (40*d*), wherein in a first measurement cycle (220), the first measuring pin (40*a*) is adapted to have a physical contact with the first socket (41) at a first position (50), the first position (50) is a position on the first socket (41) from a reference (50*b*) with a predefined first distance (43) therebetween;

the second measuring pin (40*b*) is adapted to have a physical contact with the first connector end (21) at a second position (60), the second position (60) is a position on the first connector end (21) from the reference (50*b*) with a predefined second distance (44) therebetween;

the third measuring pin (40*c*) is adapted to have a physical contact with the second socket (42) at a third position (70), the third position (70) is a position on the second socket (42) from the reference (50*b*) with a predefined third distance (45) therebetween;

the fourth measuring pin (40*d*) is adapted to have a physical contact with the second connector end (22) at a fourth position (180), the fourth position (180) is a position on the second connector end (22) from the reference (50*b*) with a predefined fourth distance (46) therebetween;

wherein in the first measurement cycle (220), upon supplying a first predefined quantity of electrical parameter to the first wire harness (20), the measuring unit (40) measures the quantity of electrical parameter between the first position (50) and the second position (60) and the quantity of electrical parameter between the third position (70) and the fourth position (180);

wherein subsequently in a second measurement cycle (230), the first measuring pin (40*a*) is adapted to have a physical contact with the first socket (41) at a fifth position (50*a*), the fifth position (50*a*) is a position on the first socket (41) from a reference (50*c*) with a predefined fifth distance (47) therebetween, wherein the magnitude of the predefined first distance (43) and the predefined fifth distance (47) are same;

the second measuring pin (40*b*) is adapted to have a physical contact with the third connector end (31) at a sixth position (60*a*), the sixth position (60*a*) is a position on the third connector end (31) from the reference (50*c*) with a predefined sixth distance (48) therebetween; wherein the magnitude of the predefined second distance (44) and the predefined sixth distance (48) are same;

the third measuring pin (40*c*) is adapted to have a physical contact with the second socket (42) at a seventh position (70*a*), the seventh position (70*a*) is a position on the second socket (42) from the reference (50*c*) with a predefined seventh distance (49) therebetween; wherein the magnitude of the predefined third distance (45) and the predefined seventh distance (49) are same;

the fourth measuring pin (40*d*) is adapted to have a physical contact with the fourth connector end (32) at an eighth position (180*a*), the eighth position (180*a*) is a position on the fourth connector end (32) from the reference (50*c*) with a predefined eighth distance (51) therebetween; wherein the magnitude of the predefined fourth distance (46) and the predefined eighth distance (51) are same;

wherein upon supplying a second predefined quantity of electrical parameter to the second wire harness (30), the measuring unit (40) measures the quantity of electrical parameter between the fifth position (50*a*) and the sixth position (60*a*) and the quantity of electrical parameter between the seventh position (70*a*) and the eighth position (180*a*), the quantity of the first predefined quantity of electrical parameters and the second predefined quantity of electrical parameters is same, the workstation (210) connected to the measuring unit (40), the measuring unit (40) sends information about measured electrical parameters from the first measurement cycle (220) and the second measurement cycle (230) to the workstation (210);

wherein the first wire harness (20) is a standard wire harness and the measured electrical parameter in the first measurement cycle (220) is a standard quantity of electrical parameter;

wherein the workstation (210) is adapted to compare the received measured electrical parameters of the first measurement cycle (220) and the second measurement cycle (230) to determine the identicalness between the first wire harness (20) and the second wire harness (30); and the display unit is adapted to display the determined identicalness details of the second wire harness (30) with respect to the first wire harness (20).

2. The system (100a) as claimed in claim 1, wherein the electrical parameter supply unit (10) is a voltage source or a current source or a frequency supply unit.

3. The system (100a) as claimed in claim 1, wherein the measuring unit (40) is a voltmeter or an ammeter or an LCR meter or a multimeter or an oscilloscope.

4. The system (100a) as claimed in claim 1, wherein the first predefined quantity of electric parameter supplied to the first wire harness (20) and the second predefined quantity of electric parameter supplied to the second wire harness (30) is an electromotive force or a frequency of an electric current or a combination of these.

5. The system (100a) as claimed in claim 1, wherein the electrical parameters measured between the first position (50) and the second position (60) is a potential difference or an electric current or a resistance or an inductance or an impendence and the electrical parameters measured between the third position (70) and the fourth position (180) is a potential difference or an electric current or a resistance or an inductance or an impendence.

6. The system (100a) as claimed in claim 1, wherein the workstation (210) includes a processing unit (11) and a memory unit (12) for storing the measured electrical parameters received from the first measurement cycle (220) and the second measurement cycle (230).

7. The system (100a) as claimed in claim 1, wherein the electric parameter supply unit (10) has an interface for controlling the operation of the electric parameter supply unit (10).

8. The system (100a) as claimed in claim 1, wherein the workstation (210) is connected to an authentication system, the authentication system is adapted to provide access of the system (100a) to an authenticated user only when the authentication system is operated accordingly.

9. The system (100a) as claimed in claim 6, wherein the details of comparison of the first measurement cycle (220) and the second measurement cycle (230) are updated in a cloud server of the memory unit (12) in real-time.

10. The system (100a) as claimed in claim 1, wherein the identicalness details between the first wire harness (20) and the second wire harness (30) includes the identicalness of the physical parameters of the second wire harness (30) with the physical parameters of the first wire harness (20), the physical parameters of the first wire harness (20) and the second wire harness (30) are the quantitative parameters as length, diameter, volume of air gap and the qualitative parameters such as efficiency of the first wire harness (20) and the second wire harness (30).

11. A system (100b) for determining identicalness amongst wire harnesses, a first wire harness (20) is having one or more first connector ends (21) and one or more second connector ends (22) joined by one or more first wire segments (23) and a second wire harness (30) is having one or more third connector ends (31) and one or more fourth connector ends (32) joined by one or more second wire segments (33), the system (100b) includes an electrical parameter supply unit (10) adapted to supply one or more electrical parameters therefrom to the first wire harness (20) when the first connector end (21) connected to a first socket (41) of the electrical parameter supply unit (10) and the second connector end (22) is connected to a second socket (42) of the electrical parameter supply unit (10) and the electrical parameter supply unit (10) operated accordingly; and the electrical parameter supply unit (10) is adapted to supply one or more electrical parameters therefrom to the second wire harness (30) when the third connector end (31) connected to a third socket (52) of the electrical parameter supply unit (10) and the fourth connector end (32) connected to a fourth socket (53) of the electrical parameter supply unit (10) and the electrical parameter supply unit (10) operated accordingly, a workstation (210) and a display unit (13) connected to the workstation (210), characterized in that the system (100b) comprises:

a first measuring unit (40ab) is having a first measuring pin (40ac), a second measuring pin (40bc), a third measuring pin (40ae) and a fourth measuring pin (40bh), the first measuring pin (40ac) is adapted to have a physical contact with the first socket (41) at a first position (50), the first position (50) is a position on the first socket (41) from a reference (50d) with a predefined first distance (43) therebetween;

the second measuring pin (40bc) is adapted to have a physical contact with the first connector end (21) at a second position (60), the second position (60) is a position on the first connector end (21) from the reference (50d) with a predefined second distance (44) therebetween;

the third measuring pin (40ae) is adapted to have a physical contact with the second socket (42) at a third position (70), the third position (70) is a position on the second socket (42) from the reference (50d) with a predefined third distance (45) therebetween, the magnitude of the predefined first distance (43) and the magnitude of the predefined third distance (45) is same;

the fourth measuring pin (40bh) is adapted to have a physical contact with the second connector end (22) at a fourth position (180), the fourth position (180) is a position on the second connector end (22) from the reference (50d) with a predefined fourth distance (46) therebetween, the magnitude of the predefined second distance (44) and the magnitude of the predefined fourth distance (46) is same;

wherein upon supplying a first predefined quantity of electrical parameters to the first wire harness (20), the first measuring unit (40ab) measures the quantity of electrical parameters between the first position (50) and the second position (60) and the quantity of electrical parameters between the third position (70) and the fourth position (180);

a second measuring unit (40be) is having a fifth measuring pin (40e), a sixth measuring pin (400, a seventh measuring pin (40g) and an eighth measuring pin (40h);

the fifth measuring pin (40e) is adapted to have a physical contact with the third socket (52) at a fifth position (50a), the fifth position (50a) is a position on the third socket (52) from the reference (50d) with a predefined fifth distance (47) therebetween, wherein the magnitude of the predefined first distance (43) and the predefined fifth distance (47) are same;

the sixth measuring pin (400 is adapted to have a physical contact with the third connector end (31) at a sixth position (60a), the sixth position (60a) is a position on the third connector end (31) from the reference (50d) with a predefined sixth distance (48) therebetween; wherein the magnitude of the predefined second distance (44) and the predefined sixth distance (48) are same;

the seventh measuring pin (40g) is adapted to have a physical contact with the fourth socket (53) at a seventh position (70a), the seventh position (70a) is a position on the fourth socket (53) from the reference (50d) with a predefined seventh distance (49) therebetween; wherein the magnitude of the predefined third distance (45) and the predefined seventh distance (49) are same;

the eighth measuring pin (40h) is adapted to have a physical contact with the fourth connector end (32) at an eighth position (180a), the eighth position (180a) is a position on the fourth connector end (32) from the reference (50d) with a predefined eighth distance (51) therebetween, wherein the magnitude of the predefined fourth distance (46) and the predefined eighth distance (51) are same;

wherein upon supplying a second predefined quantity of electrical parameters to the second wire harness (30), the second measuring unit (40ab) measures the quantity of electrical parameters between the fifth position (50a), the sixth position (60a) and the quantity of electrical parameters between the seventh position (70a) and the eighth position (180a);

the workstation (210) connected to the first measuring unit (40ab) and the second measuring unit (40be), the first measuring unit (40ab) and the second measuring unit (40be) send information about measured electrical parameters of the first wire harness (20) and the second wire harness (30) to the workstation (210), wherein the first wire harness (20) is a standard wire harness and the measured electrical parameter of the first wire harness (20) is a standard quantity of electrical parameter, wherein the workstation (210) is adapted to compare the received measured electrical parameters of the first wire harness (20) and the second wire harness (30) to determine the identicalness between the first wire harness (20) and the second wire harness (30);

the display unit (13) is adapted to display the determined identicalness details of the second wire harness (30) with respect to the first wire harness (20).

12. The system (100b) as claimed in claim 11, wherein the electrical parameters measured between the fifth position (50a) and the sixth position (60a) is a potential difference or an electric current or a resistance or an inductance or an impendence and the electrical parameters measured between the seventh position (70a) and the eighth position (180a) is a potential difference or an electric current or a resistance or an inductance or an impendence.

13. The system (100b) as claimed in claim 11, the details of comparison of the first wire harness (20) and the second wire harness (30) are updated in a cloud server of a memory unit (12) on real-time.

14. A method (200a) for determining identicalness amongst wire harnesses, a first wire harness (20) is having one or more first connector ends (21) and one or more second connector ends (22) joined by one or more first wire segments (23) and a second wire harness (20) is having one or more third connector ends (31) and one or more fourth connector ends (32) joined by one or more second wire segments (33), connecting the first connector end (21) to a first socket (41) of an electrical parameter supply unit (10) and the second connector end (22) to a second socket (42) of the electrical parameter supply unit (10), characterized in that method (200a) comprising the steps of:

making physical contact between a first measuring pin (40a) of a measuring unit (40) and a first position (50), the first position (50) is a position on the first socket (41) from a reference (50b) with a predefined first distance (43) therebetween;

making a physical contact between a second measuring pin (40b) of the measuring unit (40) and the first connector end (21) at a second position (60), the second position (60) is a position on the first connector end (21) from the reference (50b) with a predefined second distance (44) therebetween;

making a physical contact between a third measuring pin (40c) of the measuring unit (40) and the second socket (42) at a third position (70), the third position (70) is a position on the second socket (42) from the reference (50b) with a predefined third distance (45) therebetween;

making a physical contact between a fourth measuring pin (40d) of the measuring unit (40) and the second connector end (22) at a fourth position (180), the fourth position (180) is a position on the second connector end (22) from the reference (50b) with a predefined fourth distance (46) therebetween;

supplying a first predefined quantity of electrical parameters to the first wire harness (20);

measuring the quantity of electrical parameter between the first position (50) and the second position (60) and measuring the quantity of electrical parameter between the third position (70) and the fourth position (180) upon supplying a first predefined quantity of electrical parameters to the first wire harness (20);

disconnecting the first wire harness (20) from the first socket (41) and second socket (42);

connecting the second wire harness (30) to the first socket (41) and the second socket (42);

making a physical contact between the first measuring pin (40a) and the first socket (41) at a fifth position (50a), the fifth position (50a) is a position on the first socket (41) from the reference (50c) with a predefined fifth distance (47) therebetween, wherein the magnitude of the predefined first distance (43) and the predefined fifth distance (47) are same;

making a physical contact between the second measuring pin (40b) and the third connector end (31) at a sixth position (60a), the sixth position (60a) is a position on the third connector end (31) from the reference (50c) with a predefined sixth distance (48) therebetween; wherein the magnitude of the predefined second distance (44) and the predefined sixth distance (48) are same;

making a physical contact between the third measuring pin (40c) and the fourth socket (42) at a seventh position (70a), the seventh position (70a) is a position on the fourth socket (42) from the reference (50c) with a predefined seventh distance (49) therebetween; wherein the magnitude of the predefined third distance (45) and the predefined seventh distance (49) are same;

making a physical contact between the fourth measuring pin (40d) and the second socket (42) at an eighth position (180a), the eighth position (180a) is a position on the second socket (42) from the reference (50c) with a predefined eighth distance (51) therebetween;

wherein the magnitude of the predefined fourth distance (46) and the predefined eighth distance (51) are same;

supplying a second predefined quantity of electrical parameters to the second wire harness (30) by the electrical parameter supply unit (10), wherein the quantity of the first predefined quantity of electrical parameters and the second predefined quantity of electrical parameters is same;

measuring the quantity of electrical parameter between the fifth position (50a) and the sixth position (60a) by the measuring unit (40) and measuring the quantity of electric parameter between the seventh position (70a) and the eighth position (180a) by the measuring unit (40);

sending information about measured electrical parameters of the first wire harness and the second wire harness to a workstation (210) connected to the measuring unit (40), wherein the first wire harness (20) is a standard wire harness and the measured electrical parameter of the first wire harness (20) is a standard quantity of electrical parameter;

comparing the received information about measured electrical parameters of the first wire harness (20) and the second wire harness (30) by the workstation (210) to determine the identicalness between the first wire harness (20) and the second wire harness (30);

displaying the determined identicalness details of the second wire harness (30) with respect to the first wire harness (20) by a display unit (13) connected to the workstation (210).

15. A method (200b) for determining identicalness amongst wire harnesses, a first wire harness (20) is having one or more first connector ends (21) and one or more second connector ends (22) joined by one or more first wire segments (23) and a second wire harness (30) is having one or more third connector ends (31) and one or more fourth connector ends (32) joined by one or more second wire segments (33), connecting the first connector end (21) to a first socket (41) of an electrical parameter supply unit (10) and the second connector end (22) to a second socket (42) of the electrical parameter supply unit (10), characterized in that the method (200b) comprising the steps of;

making a physical contact between a first measuring pin (40ac) of a first measuring unit (40ab) and the first socket (41) at a first position (50), the first position (50) is a position on the first socket (41) from a reference (50d) with a predefined first distance (43) therebetween;

making a physical contact between a second measuring pin (40bc) of the first measuring unit (40ab) and the first connector end (21) at a second position (60), the second position (60) is a position on the first connector end (21) from the reference (50d) with a predefined second distance (44) therebetween;

making a physical contact between a third measuring pin (40ae) of the first measuring unit (40ab) and the second socket (42) at a third position (70), the third position (70) is a position on the second socket (42) from the reference (50d) with a predefined third distance (45) therebetween;

making a physical contact between a fourth measuring pin (40bh) of the first measuring unit (40ab) and the second connector end (22) at a fourth position (180), the fourth position (180) is a position on the second connector end (22) from the reference (50d) with a predefined fourth distance (46) therebetween;

supplying a first predefined quantity of electrical parameters to the first wire harness (20), measuring the quantity of electrical parameters between the first position (50) and the second position (60) and measuring the quantity of electrical parameters between the third position (70) and the fourth position (180) by the first measuring unit (40ab);

connecting the third connector end (31) to a third socket (52) of the electrical parameter supply unit (10) and the fourth connector end (32) to a fourth socket (53) of the electrical parameter supply unit (10);

making a physical contact between a fifth measuring pin of the second measuring unit (40a) and the third socket (52) at a fifth position (50a), the fifth position (50a) is a position on the third socket (52) from the reference (50d) with a predefined fifth distance (47) therebetween, wherein the magnitude of the predefined first distance (41) and the predefined fifth distance (47) are same;

making a physical contact between a sixth measuring pin (400 and the third connector end (31) at a sixth position (60a), the sixth position (60a) is a position on the third connector end (31) from the reference (50d) with a predefined sixth distance (48) therebetween; wherein the magnitude of the predefined second distance (44) and the predefined sixth distance (48) are same;

making a physical contact between the seventh measuring pin (40g) and the fourth socket (53) at a seventh position (70a), the seventh position (70a) is a position on the fourth socket (53) from the reference (50d) with a predefined seventh distance (49) therebetween; wherein the magnitude of the predefined third distance (45) and the predefined seventh distance (49) are same;

making a physical contact between the eighth measuring pin (40h) and the fourth connector end (32) at an eighth position (180a), the eighth position (180a) is a position on the second socket (53) from the reference (50d) with a predefined eighth distance (51) therebetween; wherein the magnitude of the predefined fourth distance (46) and the predefined eighth distance (51) are same;

supplying a second predefined quantity of electrical parameters to the second wire harness (30), the quantity of the first predefined quantity of electrical parameters and the second predefined quantity of electrical parameters is same;

measuring the quantity of electrical parameters between the fifth position (50a) and the sixth position (60a) by the first measuring unit (40ab) and measuring the quantity of electrical parameters between the seventh position (70a) and the eighth position (180a) by the second measuring unit (40be), sending information about measured electrical parameters of the first wire harness (20) and the second wire harness (30) to a workstation (210) by the first measuring unit (40ab) and the second measuring unit (40be) respectively, wherein the first wire harness (20) is a standard wire harness and the measured electrical parameter of the first wire harness (20) is a standard quantity of electrical parameter comparing the received measured electrical parameters of the first wire harness (20) and the second wire harness (30) to determine the identicalness between the first wire harness (20) and the second wire harness (30);

displaying the determined identicalness details the second wire harness (30) with respect to the first wire harness (20) by a display unit (13) connected to the workstation (210).

\* \* \* \* \*